United States Patent
Yamahira

(10) Patent No.: US 8,319,531 B2
(45) Date of Patent: Nov. 27, 2012

(54) MULTI-PHASE CLOCK DIVIDER CIRCUIT

(75) Inventor: Seiji Yamahira, Kyoto (JP)

(73) Assignee: Panasonic Corporation, Osaka (JP)

( * ) Notice: Subject to any disclaimer, the term of this patent is extended or adjusted under 35 U.S.C. 154(b) by 98 days.

(21) Appl. No.: 12/902,904

(22) Filed: Oct. 12, 2010

(65) Prior Publication Data

US 2011/0025381 A1 Feb. 3, 2011

Related U.S. Application Data

(63) Continuation of application No. PCT/JP2009/003191, filed on Jul. 8, 2009.

(30) Foreign Application Priority Data

Jul. 9, 2008 (JP) ................................. 2008-179565

(51) Int. Cl.
*H03K 21/00* (2006.01)
*H03K 23/00* (2006.01)
*H03K 25/00* (2006.01)

(52) U.S. Cl. ......... 327/115; 327/114; 327/117; 327/118

(58) Field of Classification Search .................. 327/115, 327/116, 117, 118, 355–361, 202, 203, 208–212, 327/218, 231–305; 377/47, 48
See application file for complete search history.

(56) References Cited

U.S. PATENT DOCUMENTS

| | | | | |
|---|---|---|---|---|
| 5,150,364 A | * | 9/1992 | Negus | 370/542 |
| 5,686,850 A | * | 11/1997 | Takaki et al. | 327/261 |
| 5,764,092 A | | 6/1998 | Wada et al. | |
| 5,774,023 A | * | 6/1998 | Irwin | 331/17 |
| 6,392,462 B2 | * | 5/2002 | Ebuchi et al. | 327/295 |
| 2001/0010475 A1 | | 8/2001 | Miura et al. | |
| 2003/0080793 A1 | * | 5/2003 | Pilling | 327/202 |
| 2009/0212833 A1 | * | 8/2009 | Mitsuishi | 327/115 |
| 2011/0089987 A1 | * | 4/2011 | Yang | 327/295 |

FOREIGN PATENT DOCUMENTS

| | | |
|---|---|---|
| JP | 04-002216 | 1/1992 |
| JP | 08-154044 | 6/1996 |
| JP | 09-051255 | 2/1997 |
| JP | 2001-350539 | 12/2001 |
| WO | WO 02/082652 A2 | 10/2002 |

* cited by examiner

*Primary Examiner* — Lincoln Donovan
*Assistant Examiner* — Brandon S Cole
(74) *Attorney, Agent, or Firm* — McDermott Will & Emery LLP

(57) ABSTRACT

A divider circuit for dividing the frequency of a multi-phase clock signal, which can ensure a sufficient data latch time even if the multi-phase clock signal has a high frequency, includes a main latch circuit which generates an inverted data signal using, for example, two of eight clock signals of an eight-phase clock signal, and a sub-latch circuit which uses the eight clock signals as a trigger to receive the inverted data signal as a common data signal.

17 Claims, 14 Drawing Sheets

MULTI-PHASE CLOCK DIVIDER CIRCUIT

CROSS-REFERENCE TO RELATED APPLICATIONS

This is a continuation of PCT International Application PCT/JP2009/003191 filed on Jul. 8, 2009, which claims priority to Japanese Patent Application No. 2008-179565 filed on Jul. 9, 2008. The disclosures of these applications including the specifications, the drawings, and the claims are hereby incorporated by reference in their entirety.

BACKGROUND

The present disclosure relates to multi-phase clock divider circuits capable of accurately dividing the frequency of a multi-phase clock signal which oscillates at a high frequency while maintaining the phase relationship of the signal.

In recent years, flash memories, which are a non-volatile semiconductor memory device, have required data to be read and rewritten with a single power supply voltage or a low power supply voltage, and the flash memory requires, on the same chip, a booster circuit which supplies a boosted voltage or a negative boosted voltage when each operation is performed.

There is a technique of reducing the circuit area of the booster circuit by operating the booster circuit in accordance with a boost clock signal having a higher frequency. On the other hand, after a predetermined voltage is output as the boosted voltage, a technique of operating the boost clock signal at a low frequency is required so as to reduce noise, current consumption, and the like. Moreover, a multi-phase clock signal is used in the booster circuit, and the phase relationship of the signal has a key role in the boost operation. Therefore, a multi-phase clock divider circuit is required which can divide the frequency of the multi-phase clock signal oscillating at a high frequency while maintaining the phase relationship of the signal.

FIG. 13 shows a configuration of a divider circuit described in Japanese Patent Publication No. 2001-350539. The divider circuit 900 includes latch circuits DFF<0>-DFF<7> which receive a multi-phase clock signal including clock signals CLK<0>-CLK<7> and output frequency-divided clock signals FCK<0>-FCK<7> having multiple phases, and logic elements NR<0>-NR<6> which receive the inverted output NQ of the latch circuit DFF<I>(0≦I≦6) and the output Q of the latch circuit DFF<I+1> and generates a data signal to the latch circuit DFF<I+1>. Only the latch circuit DFF<0> receives the inverted output NQ of itself as its data signal.

Next, operation of the divider circuit 900 of FIG. 13 will be briefly described with reference to FIG. 14.

[Time T0: Initial State]

Initially, at time T0, the outputs Q (the frequency-divided clock signals FCK<0>-FCK<7>) of the latch circuits DFF<0>-DFF<7> are "low" (logical low level), and the inverted outputs NQ are "high" (logical high level). Therefore, the data signals DT0-DT6 of the logic elements NR<0>-NR<6> are fixed low. During a period that the data signals DT0-DT6 are low, the outputs Q (the frequency-divided clock signals FCK<0>-FCK<7>) of the latch circuits DFF<0>-DFF<7> are fixed to low irrespective of the inputs of the clock signals CLK<1>-CLK<7>. On the other hand, the input data signal of the latch circuit DFF<0> is the inverted output NQ of itself and therefore is high.

[Time T1]

At time T1, the clock signal CLK<0> goes high, so that the output Q of the latch circuit DFF<0> goes high and the inverted output NQ goes low. As a result, the frequency-divided clock signal FCK<0> goes high, and the data signal DT0 goes high and is input to the latch circuit DFF<1>, which receives the data signal DT0 in a high-data latch time Tlatr or less. Here, the high-data latch time Tlatr is (1/clock frequency fosc)/number of phases in the multi-phase clock signal. For example, when the clock frequency fosc=100 MHz and the number of phases in the multi-phase clock signal=8, the high-data latch time Tlatr=1.25 ns.

[Time T2]

At time T2, the clock signal CLK<1> goes high, so that the data (DT0=high) received by the output latch circuit DFF<1> is output, and the output Q goes high and the inverted output NQ goes low. As a result, the frequency-divided clock signal FCK<1> goes high, and the data signal DT1 goes high and is input to the latch circuit DFF<2>, which receives the data signal DT1 in the high-data latch time Tlatr or less. At the same time, the data signal DT0 goes low.

Subsequently, at times T3-T8, frequency division is similarly performed by the latch circuits DFF<2>-DFF<7>. During this time period, at time T6, the clock signal CLK<1> goes low, so that the latch circuit DFF<1> receives the data signal DT0 (=low) input to the data terminal D in a low-data latch time Tlatf or less. Here, the low-data latch time Tlatf is independent of the number of phases in the multi-phase clock signal and dependent largely on the clock frequency, and is almost equal to (1/clock frequency fosc)/2. For example, when the clock frequency fosc=100 MHz, the low-data latch time Tlatf=5 ns. Subsequently, similar operation is performed at times T9-T17.

SUMMARY

The divider circuit of Japanese Patent Publication No. 2001-350539 has a problem that when the clock frequency is increased or when the number of phases in the multi-phase clock signal is increased, a sufficient high-data latch time Tlatr cannot be ensured, so that the frequency of the clock signal cannot be accurately divided.

An example divider circuit includes M first dividers configured to receive M first signals, where M is an integer of 1 or more, and N second dividers configured to receive N second signals, where N is an integer more than or equal to M. An I-th one of the first dividers outputs a third signal obtained by dividing a frequency of one of the first signals input to the I-th first divider, where I is an integer of 1 to M. A K-th one of the second dividers outputs a fourth signal having a frequency similar to that of the third signal input to the K-th second divider based on one of the second signals input to the K-th second divider, where K is an integer of 1 to N.

Another example divider circuit includes M first dividers configured to receive M first signals, where M is an integer of 1 or more; and N second dividers configured to receive N second signals, where N is an integer more than or equal to M. An I-th one of the first dividers has a first input terminal to which the corresponding first signal is input, a first output terminal from which a third signal obtained by dividing a frequency of the corresponding first signal is output, and a second input terminal to which the third signal of the (I−1)th first divider is input, where I is an integer of 2 to M. A K-th one of the second dividers has a third input terminal to which the corresponding second signal is input, a fourth input terminal to which the corresponding third signal is input, and a second output terminal from which a fourth signal having a frequency similar to that of the corresponding third signal is output, where K is an integer of 1 to N.

According to the present disclosure, a sufficient data latch time can be ensured for all latch circuits in a divider circuit, and the phase relationship can be maintained. As a result, an accurate frequency-divided clock signal can be generated from a multi-phase clock signal having a high frequency.

DETAILED DESCRIPTION

Figure 1:
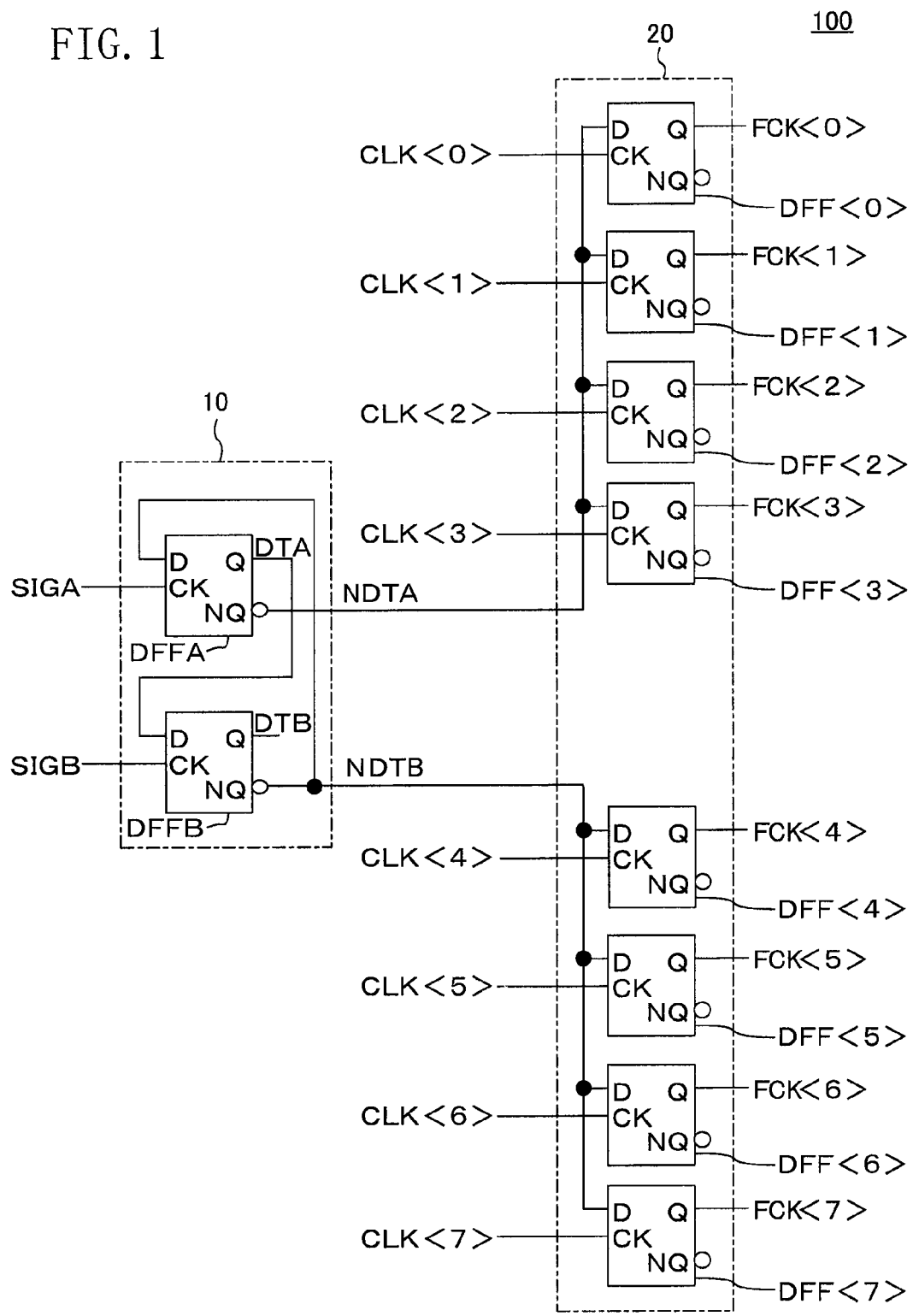
FIG. 1 is a block diagram showing a configuration of a divider circuit according to a first embodiment of the present disclosure.

Embodiments of the present disclosure will be described hereinafter with reference to the accompanying drawings. Note that like parts are indicated by like reference characters.

First Embodiment

<Configuration>

FIG. 1 shows a divider circuit 100 which includes a main latch circuit 10 and a sub-latch circuit 20. A multi-phase clock signal including clock signals CLK<0>-CLK<7> having a frequency fosc is input to the divider circuit 100. The main latch circuit 10 receives CLK<3> as a reference clock signal SIGA and CLK<7> as a reference clock signal SIGB, which are trigger signals which cause the main latch circuit 10 to start frequency division with respect to the reference clock signals SIGA and SIGB and then output inverted data signals NDTA and NDTB. The sub-latch circuit 20 receives the inverted data signals NDTA and NDTB at its data terminals D, divides the frequency of the clock signals CLK<0>-CLK<7>, and outputs the resultant frequency-divided clock signals FCK<0>-FCK<7>.

More specifically, the main latch circuit 10 includes a latch circuit DFFA which receives the reference clock signal SIGA as a trigger to output a frequency-divided clock signal having a frequency of fosc/2 as a data signal DTA and an inverted data signal NDTA, and a latch circuit DFFB which receives the reference clock signal SIGB as a trigger to output a frequency-divided clock signal having a frequency of fosc/2 as a data signal DTB and an inverted data signal NDTB. The inverted data signal NDTB is input to the data terminal D of the latch circuit DFFA, and the data signal DTA is input to the data terminal D of the latch circuit DFFB.

On the other hand, the sub-latch circuit 20 includes latch circuits DFF<0>-DFF<3> which receive the inverted data signal NDTA and use the clock signals CLK<0>-CLK<3> as a trigger to output the frequency-divided clock signals FCK<0>-FCK<3>, and latch circuits DFF<4>-DFF<7> which receive the inverted data signal NDTB and use the clock signals CLK<4>-CLK<7> as a trigger to output the frequency-divided clock signals FCK<4>-FCK<7>.

Next, operation of the divider circuit 100 of FIG. 1 will be briefly described with reference to FIG. 2.

[Time T0: Initial State]

Initially, at time T0, the output Q of the latch circuit DFFA is low (DTA=low), and the inverted output NQ is high (NDTA=high), while the output Q of the latch circuit DFFB is also low (DTB=low), and the inverted output NQ is high (NDTB=high). Therefore, because the reference clock signal SIGA is low, the latch circuit DFFA receives the inverted data signal NDTB (=high). Also, the inverted data signal NDTA (=high) is input to the data terminals D of the latch circuits DFF<0>-DFF<3>, and the inverted data signal NDTB (=high) is input to the data terminals D of the latch circuits DFF<4>-DFF<7>. Because the clock signals CLK<0>-CLK<3> are low, the latch circuits DFF<0>-DFF<3> receive the inverted data signal NDTA (=high). The outputs Q (the frequency-divided clock signals FCK<0>-FCK<7>) of the latch circuits DFF<0>-DFF<7> are all fixed low.

[Time T1]

At time T1, the clock signal CLK<0> goes high, so that the output Q of the latch circuit DFF<0> goes high. As a result, the frequency-divided clock signal FCK<0> goes high. Also, the clock signal CLK<4> goes low, so that the latch circuit DFF<4> receives the inverted data signal NDTB (=high) input to the data terminal D.

Subsequently, at times T2 and T3, similarly, the outputs Q of the latch circuits DFF<1> and DFF<2> go high, while the latch circuits DFF<5> and <6> receive the inverted data signal NDTB (=high).

[Time T4]

At time T4, the clock signal CLK<3> goes high, so that the output Q of the latch circuit DFF<3> goes high. As a result, the frequency-divided clock signal FCK<3> goes high. On the other hand, the clock signal CLK<7> goes low, so that the latch circuit DFF<7> receives the inverted data signal NDTB (=high) input to the data terminal D. Here, the clock signal CLK<3> which is a trigger signal to the last latch circuit DFF<3> that uses the inverted data signal NDTA goes high, and therefore, even if the logic value of the inverted data signal NDTA is changed, false latch operation does not occur. Because the reference clock signal SIGA (CLK<3>) goes high, the output Q (DTA) and the inverted output NQ (NDTA) of the latch circuit DFFA go high and low, respectively. As a result, the inverted data signal NDTA input to the data terminals D of the latch circuits DFF<0>-DFF<3> are changed from high to low. Also, because the reference clock signal SIGB (=CLK<7>) is low, the latch circuit DFFB receives the data DTA (=high) input to the data terminal D in a low-data latch time Tlatfm or less. Here, the low-data data latch time Tlatfm is independent of the number of phases in the multiple phase clock signal and dependent largely on the clock frequency, and is almost equal to (1/clock frequency fosc)/2. For example, when the clock frequency fosc=100 MHz, the low-data latch time Tlatfm=5 ns.

[Time T5]

At time T5, the clock signal CLK<4> goes high, so that the output Q of the latch circuit DFF<4> goes high. As a result, the frequency-divided clock signal FCK<4> goes high. On the other hand, the clock signal CLK<0> goes low, so that the latch circuit DFF<0> receives the inverted data signal NDTA (=low) input to the data terminal D in a low-data latch time Tlatf or less. Here, the low-data latch time Tlatf is independent of the number of phases in the multiple phase clock signal and dependent largely on the clock frequency, and is almost equal to (1/clock frequency fosc)/2. For example, when the clock frequency fosc=100 MHz, the low-data latch time Tlatf=5 ns.

Subsequently, at times T6 and T7, similarly, the outputs Q of the latch circuits DFF<5> and DFF<6> go high, while the latch circuits DFF<1> and <2> receive the inverted data signal NDTA (=low) in the low-data latch time Tlatf or less.

[Time T8]

At time T8, the clock signal CLK<7> goes high, so that the output Q of the latch circuit DFF<7> goes high. As a result, the frequency-divided clock signal FCK<7> goes high. On the other hand, the clock signal CLK<3> goes low, so that the latch circuit DFF<3> receives the inverted data signal NDTA (=low) input to the data terminal D in the low-data latch time Tlatf or less. Here, the clock signal CLK<7> which is a trigger signal to the last latch circuit DFF<7> that uses the inverted data signal NDTB goes high, and therefore, even if the logic value of the inverted data signal NDTB is changed, false latch operation does not occur. Because the reference clock signal SIGB goes high, the output Q (DTB) and the inverted output NQ (NDTB) of the latch circuit DFFB go high and low, respectively. As a result, the inverted data signal NDTB input to the data terminals D of the latch circuits DFF<4>-DFF<7> is changed from high to low. Also, because the reference clock signal SIGA (=CLK<3>) is low, the latch circuit DFFA receives the inverted data signal NDTB (=low) input to the data terminal D in a high-data latch time Tlatrm or less. Here, the high-data latch time Tlatrm is independent of the number of phases in the multiple phase clock signal and dependent largely on the clock frequency, and is almost equal to (1/clock frequency fosc)/2. For example, when the clock frequency fosc=100 MHz, the high-data latch time Tlatrm=5 ns.

[Time T9]

At time T9, the clock signal CLK<0> goes high, so that the output Q of the latch circuit DFF<0> goes low. As a result, the frequency-divided clock signal FCK<0> goes low. On the other hand, the clock signal CLK<4> goes low, so that the latch circuit DFF<4> receives the inverted data signal NDTB (=low) input to the data terminal D in the low-data latch time Tlatf or less.

Subsequently, at times T10 and T11, similarly, the outputs Q of the latch circuits DFF<1> and DFF<2> go low, while the latch circuits DFF<5> and <6> receive the inverted data signal NDTB (=low) in the low-data latch time Tlatf or less.

[Time T12]

At time T12, the clock signal CLK<3> goes high, so that the output Q of the latch circuit DFF<3> goes low. As a result, the frequency-divided clock signal FCK<3> goes low. On the other hand, the clock signal CLK<7> goes low, so that the latch circuit DFF<7> receives the inverted data signal NDTB (=low) input to the data terminal D in the low-data latch time Tlatf or less. Here, the clock signal CLK<3> which is a trigger signal to the last latch circuit DFF<3> that uses the inverted data signal NDTA goes high, and therefore, even if the logic value of the inverted data signal NDTA is changed, false latch operation does not occur. Because the reference clock signal SIGA goes high, the output Q (DTA) and the inverted output NQ (NDTA) of the latch circuit DFFA go low and high, respectively. As a result, the inverted data signal NDTA input to the data terminals D of the latch circuits DFF<0>-DFF<3> are changed from low to high. Also, because the reference clock signal SIGB (=CLK<7>) is low, the latch circuit DFFB receives the data DTA (=low) input to the data terminal D in the latch time Tlatfm or less.

[Time T13]

At time T13, the clock signal CLK<4> goes high, so that the output Q of the latch circuit DFF<4> goes low. As a result, the frequency-divided clock signal FCK<4> goes low. On the other hand, the clock signal CLK<0> goes low, so that the latch circuit DFF<0> receives the inverted data signal NDTA (=high) input to the data terminal D in a high-data latch time Tlatr or less. Here, the high-data latch time Tlatr is independent of the number of phases in the multiple phase clock signal and dependent largely on the clock frequency, and is almost equal to (1/clock frequency fosc)/2. For example, when the clock frequency fosc=100 MHz, the high-data latch time Tlatr=5 ns.

Subsequently, at times T14 and T15, similarly, the outputs Q of the latch circuits DFF<5> and DFF<6> go low, while the latch circuits DFF<1> and <2> receive the inverted data signal NDTA (=high) in the high-data latch time Tlatr or less.

[Time T16]

At time T16, the clock signal CLK<7> goes high, so that the output Q of the latch circuit DFF<7> goes low. As a result, the frequency-divided clock signal FCK<7> goes low. On the other hand, the clock signal CLK<3> goes low, so that the latch circuit DFF<3> receives the inverted data signal NDTA (=high) input to the data terminal D in the high-data latch time Tlatr or less. Here, the clock signal CLK<7> which is a trigger signal to the last latch circuit DFF<7> that uses the inverted data signal NDTB goes high, and therefore, even if the logic value of the inverted data signal NDTB is changed, false latch operation does not occur. Because the reference clock signal SIGB goes high, the output Q (DTB) and the inverted output NQ (NDTB) of the latch circuit DFFB go low and high, respectively. As a result, the inverted data signal NDTB input to the data terminals D of the latch circuits DFF<4>-DFF<7> are changed from low to high. Also, because the reference clock signal SIGA (=CLK<3>) is low, the latch circuit DFFA receives the inverted data signal NDTB (=high) input to the data terminal D in the latch time Tlatfm or less.

[Time T17]

At time T17, the clock signal CLK<0> goes high, so that the output Q of the latch circuit DFF<0> goes high. As a result, the frequency-divided clock signal FCK<0> goes high, so that the frequency-divided clock signal FCK<0> which has a frequency which is ½ of the frequency fosc of the clock signal CLK<0>, is generated. On the other hand, the clock signal CLK<4> goes low, so that the latch circuit DFF<4> receives the inverted data signal NDTB (=high) input to the data terminal D in the high-data latch time Tlatr or less.

Subsequently, at times T18 and T19, similarly, the outputs Q of the latch circuits DFF<1> and DFF<2> go high, so that the frequency-divided clock signals FCK<1> and FCK<2> having a frequency which is ½ of the frequency of the clock signals CLK<1> and CLK<2>, are generated. On the other hand, the latch circuits DFF<5> and <6> receive the inverted data signal NDTB (=high) in the high-data latch time Tlatr or less.

[Time T20]

At time T20, the clock signal CLK<3> goes high, so that the output Q of the latch circuit DFF<3> goes high. As a result, the frequency-divided clock signal FCK<3> goes high. On the other hand, the clock signal CLK<7> goes low, so that the latch circuit DFF<7> receives the inverted data signal NDTB (=high) input to the data terminal D in the high-data latch time Tlatr or less. Here, the output Q (FCK<3>) of the last latch circuit DFF<3> that uses the inverted data signal NDTA goes high, and therefore, even if the logic value of the inverted data signal NDTA is changed, false latch operation does not occur. Because the reference clock signal SIGA goes high, the output Q (DTA) and the inverted output NQ (NDTA) of the latch circuit DFFA go high and low, respectively. As a result, the inverted data signal NDTA input to the data terminals D of the latch circuits DFF<0>-DFF<3> are changed from high to low. Also, because the reference clock signal SIGB (=CLK<7>) is low, the latch circuit DFFB receives the data DTA (=high) input to the data terminal D.

Figure 2:
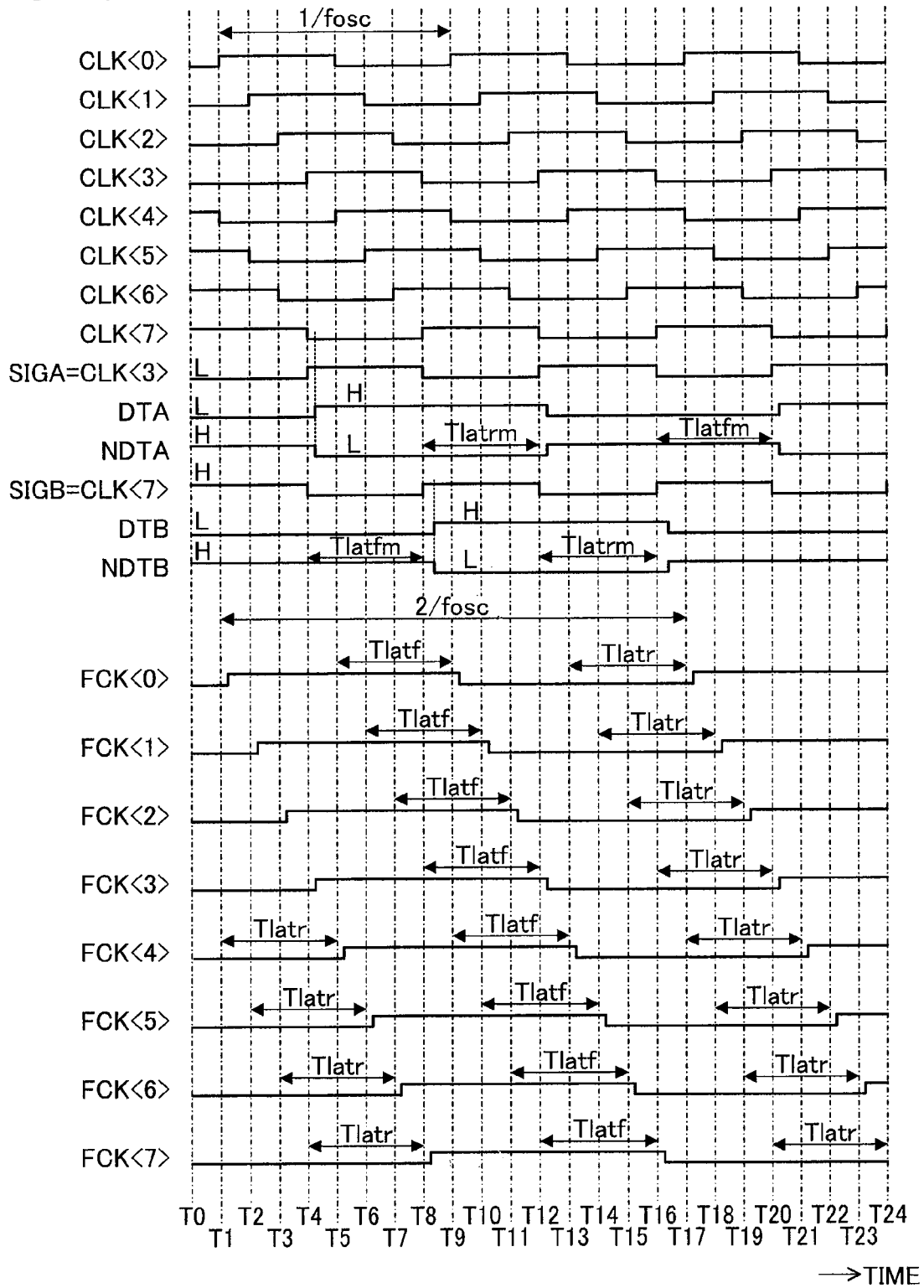
FIG. 2 is a timing diagram showing operation of the divider circuit of FIG. 1.

Subsequently, after, at time T21, transitioning to the same state as that of time T5, the divider circuit 100 of FIG. 1 transitions at times T22, T23, and T24 as shown in FIG. 2. As a result of the aforementioned operation, the frequency-divided clock signals FCK<0>-FCK<7> are repeatedly accurately generated while the phase relationship of the clock signals CLK<0>-CLK<7> is maintained.

Note that the logic value of the inverted data signal NDTA may be changed at any timing after a trigger signal (e.g., the clock signal CLK<3>) to the last latch circuit (e.g., the latch circuit DFF<3>) that uses the inverted data signal NDTA goes high and until a trigger signal (e.g., the clock signal CLK<0>) to the first latch circuit (e.g., the latch circuit DFF<0>) that uses the inverted data signal NDTA goes from low to high.

If the multi-phase clock signal includes clock signals CLK<0>-CLK<N>(N≧3), the last latch circuit can be selected from DFF<K>(1≦K≦N−1).

When it is assumed that the last and first latch circuits that use the inverted data signal NDTA are DFF<K> and DFF<0>, respectively, the reference clock signal SIGA of the latch circuit DFFA may be any of the clock signals CLK<K>-CLK<N>, or alternatively, a clock signal calculated from the clock signals CLK<K>-CLK<N> or a clock signal obtained by delaying the clock signals CLK<K>-CLK<N>. In the example shown, the multi-phase clock signal includes the clock signals CLK<0>-CLK<7>, and the last and first latch circuits that use the inverted data signal NDTA are assumed to be DFF<3> and DFF<0>, respectively. In this case, the reference clock signal SIGA of the latch circuit DFFA may be any of the clock signals CLK<3>-CLK<7>, or alternatively, a clock signal calculated from the clock signals CLK<3>-CLK<7> or a clock signal obtained by delaying the clock signals CLK<3>-CLK<7>.

The logic value of the inverted data signal NDTB may be changed at any timing after a trigger signal (e.g., the clock signal CLK<7>) to the last latch circuit (e.g., the latch circuit DFF<7>) that uses the inverted data signal NDTB goes high and until a trigger signal (e.g., the clock signal CLK<4>) to the first latch circuit (e.g., the latch circuit DFF<4>) that uses the inverted data signal NDTB goes from low to high.

If the multi-phase clock signal includes clock signals CLK<0>-CLK<N>(N≧3), then when latch circuits which use the inverted data signal NDTA are assumed to be DFF<0>-DFF<K>, the first latch circuit that uses the inverted data signal NDTB is DFF<K+1>(1≦K≦N−1), and the last latch circuit that uses the inverted data signal NDTB is DFF<N>. The reference clock signal SIGB of the latch circuit DFFB may be any of the clock signals CLK<N> and CLK<0>-CLK<K>, or alternatively, a clock signal calculated from the clock signals CLK<N> and CLK<0>-CLK<K> or a clock signal obtained by delaying the clock signals CLK<N> and CLK<0>-CLK<K>. In the example shown, the multi-phase clock signal includes the clock signals CLK<0>-CLK<7>, and the last and first latch circuits that use the inverted data signal NDTB are assumed to be DFF<7> and DFF<4>, respectively. In this case, the reference clock signal SIGB of the latch circuit DFFB may be any of the clock signals CLK<7> and CLK<0>-CLK<3>, or alternatively, a clock signal calculated from the clock signals CLK<7> and CLK<0>-CLK<3> or a clock signal obtained by delaying the clock signals CLK<7> and CLK<0>-CLK<3>.

Figure 3:
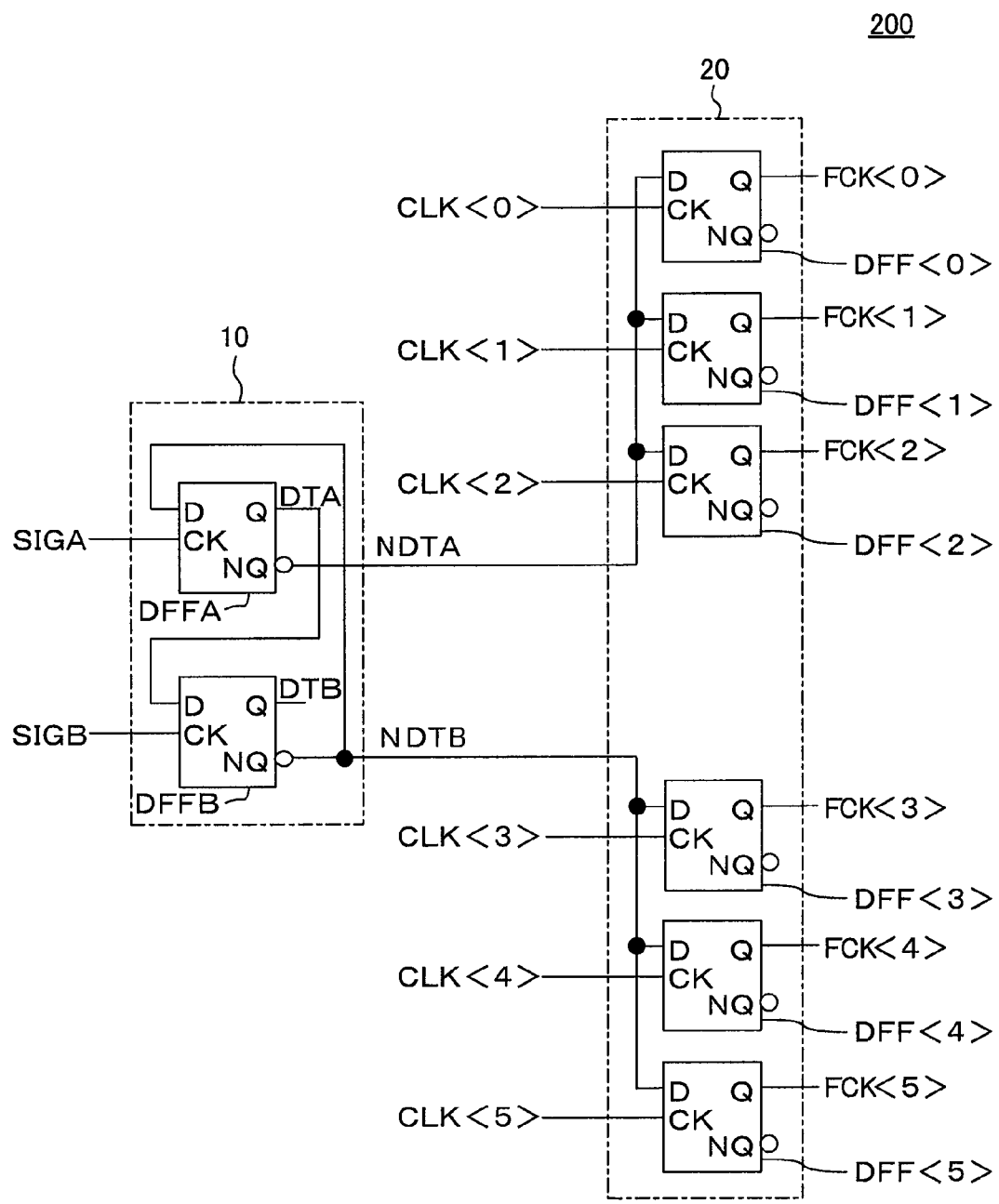
FIG. 3 is a block diagram showing another example of the first embodiment of the present disclosure.

Although an example in which an eight-phase clock signal including the clock signals CLK<0>-CLK<7> is used has been described above, similar operation and advantages can be obtained as long as the multi-phase clock signal includes an even number of clock signals, i.e., an even number of phases (e.g., a divider circuit 200 having a configuration shown in FIG. 3).

Figure 4:
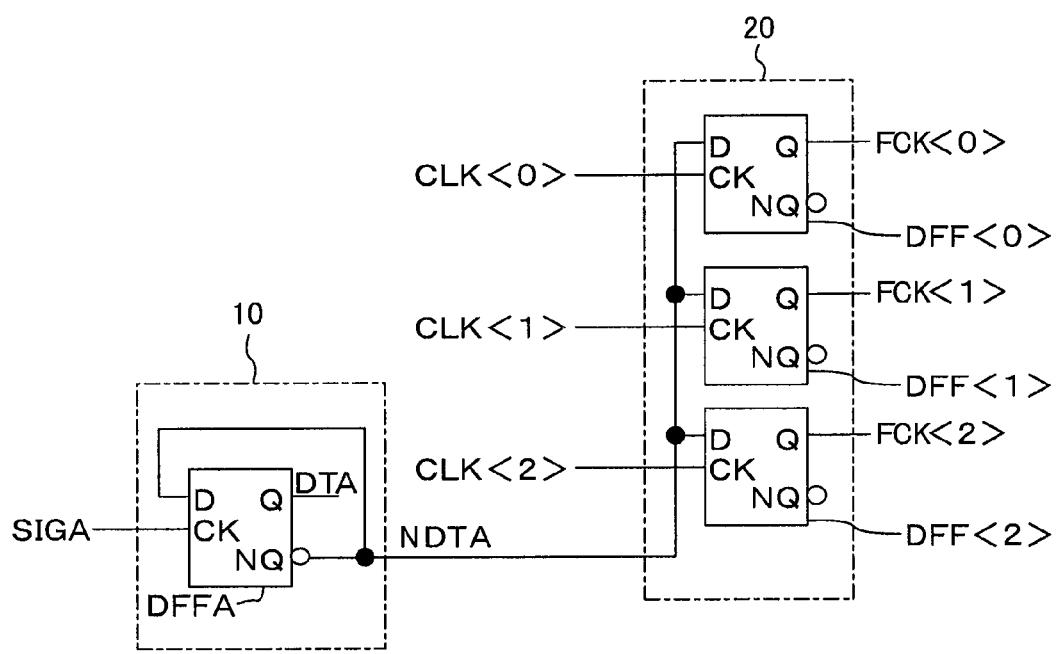
FIG. 4 is a block diagram showing still another example of the first embodiment of the present disclosure.

In the aforementioned example, two of the clock signals CLK<0>-CLK<7> are used as the reference clock signals SIGA and SIGB, and the main latch circuit 10 includes the latch circuits DFFA and DFFB. Alternatively, when the frequency of only clock signals having a phase of 0-180 degrees is divided, similar operation and advantages can be obtained in a divider circuit 250 having a configuration shown in FIG. 4 which is a variation of FIG. 3, in which only the reference clock signal SIGA is used and the main latch circuit 10 includes only the latch circuit DFFA. Of course, the frequency division of clock signals having a phase of 180 degrees or more may be allowed by design margin. Similarly, a configuration in which only the reference clock signal SIGB is used and the main latch circuit 10 includes only the latch circuit DFFB may be employed.

In the aforementioned example, the two reference clock signals SIGA and SIGB are provided, the main latch circuit 10 includes the two latch circuits DFFA and DFFB corresponding to the two signals, the latch circuits DFFA and DFFB output the two inverted data signals NDTA and NDTB, and the sub-latch circuit 20 includes the latch circuits DFF<0>-DFF<3> and the latch circuits DFF<4>-DFF<7> corresponding to the two inverted data signals NDTA and NDTB, respectively. Alternatively, M reference clock signals (M is an integer of 1 or more) may be provided, the main latch circuit 10 may include M latch circuits corresponding to the M signals, the M latch circuits of the main latch circuit 10 may output M inverted data signals, and the sub-latch circuit 20 may include M latch circuits corresponding to the M inverted data signals.

<Advantages>

As described above, provided are the main latch circuit 10 which is operated using a multi-phase clock signal including clock signals having different phases and the same frequency as a trigger to generate frequency-divided clocks for generation of inverted data signals and the sub-latch circuit 20 which uses the inverted data signals to generate frequency-divided clock signals from the multi-phase clock signal. Therefore, a sufficient data latch time can be ensured for all latch circuits used in a divider circuit, and the phase relationship can be maintained. As a result, accurate frequency-divided clock signals can be generated from a multi-phase clock signal having a high frequency.

Moreover, the timing of generating the inverted data signal can be arbitrarily controlled using the multi-phase clock signal and a delay circuit, and therefore, a sufficient circuit operating margin can be ensured.

Second Embodiment

<Configuration>

Figure 5:
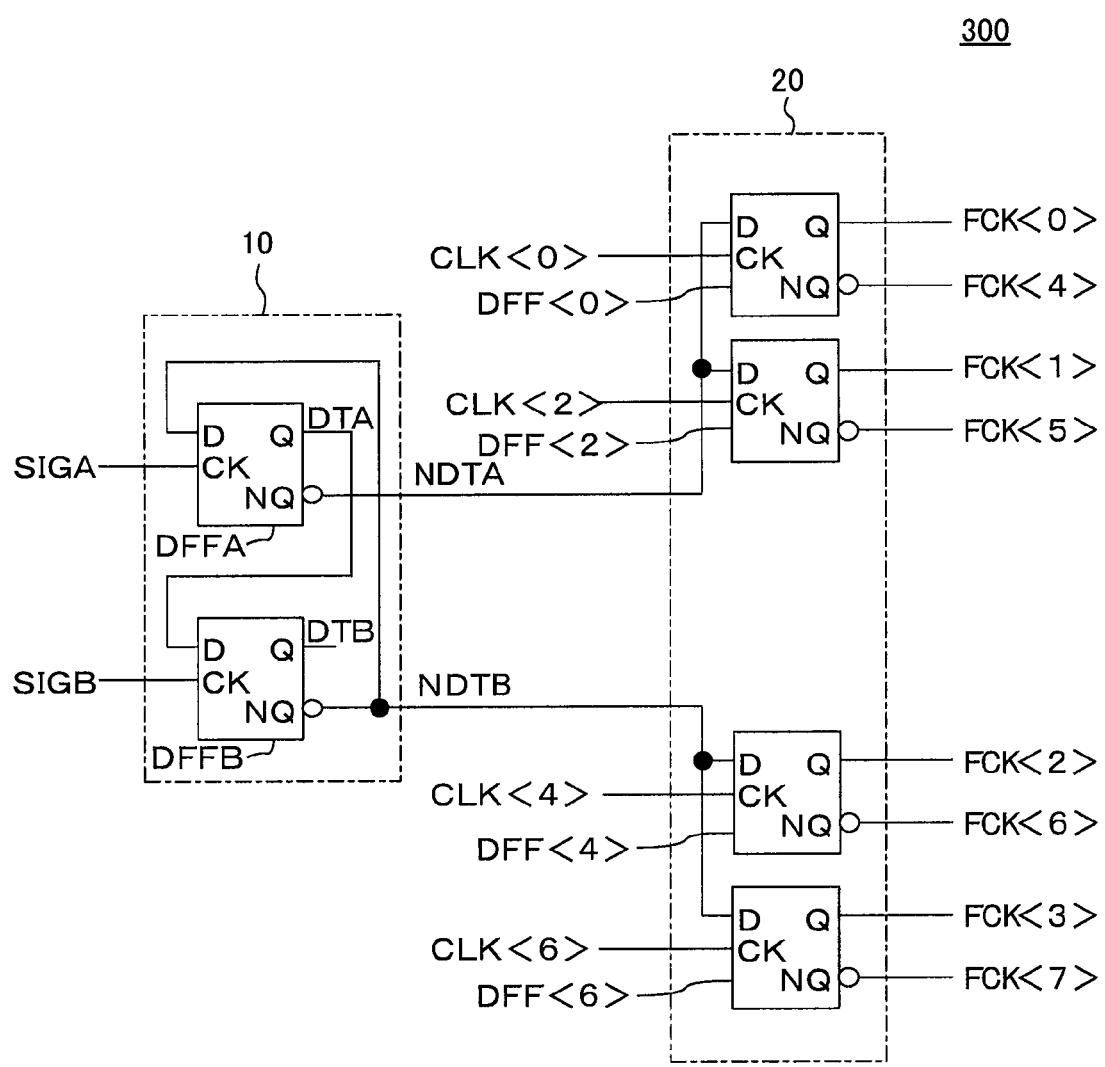
FIG. 5 is a block diagram showing a configuration of a divider circuit according to a second embodiment of the present disclosure.

FIG. 5 shows a divider circuit 300 according to a second embodiment which divides the frequency of clock signals CLK<0>-CLK<N>(N is an odd number of 1 or more). The divider circuit 300 of the second embodiment is different from that of the first embodiment in which only latch circuits DFF<2×I>(0≦I≦(N−1)/2) are used in the sub-latch circuit 20.

The relationship between clock signals input to the latch circuits DFF<2×I> and frequency-divided clock signals output from the latch circuits DFF<2×I> is described as follows. Specifically, the clock signals CLK<2×I> of the clock signals CLK<0>-CLK<N> are input to the latch circuits DFF<2×I>, and the frequency-divided clock signals FCK<I> are output from the outputs Q of the latch circuits DFF<2×I> and the frequency-divided clock signals FCK<I+(N+1)/2> are output from the inverted outputs NQ of the latch circuits DFF<2×I>. Of course, the frequency-divided clock signals FCK<I+(N+1)/2> may be generated from the frequency-divided clock signals FCK<I>.

Figure 6:
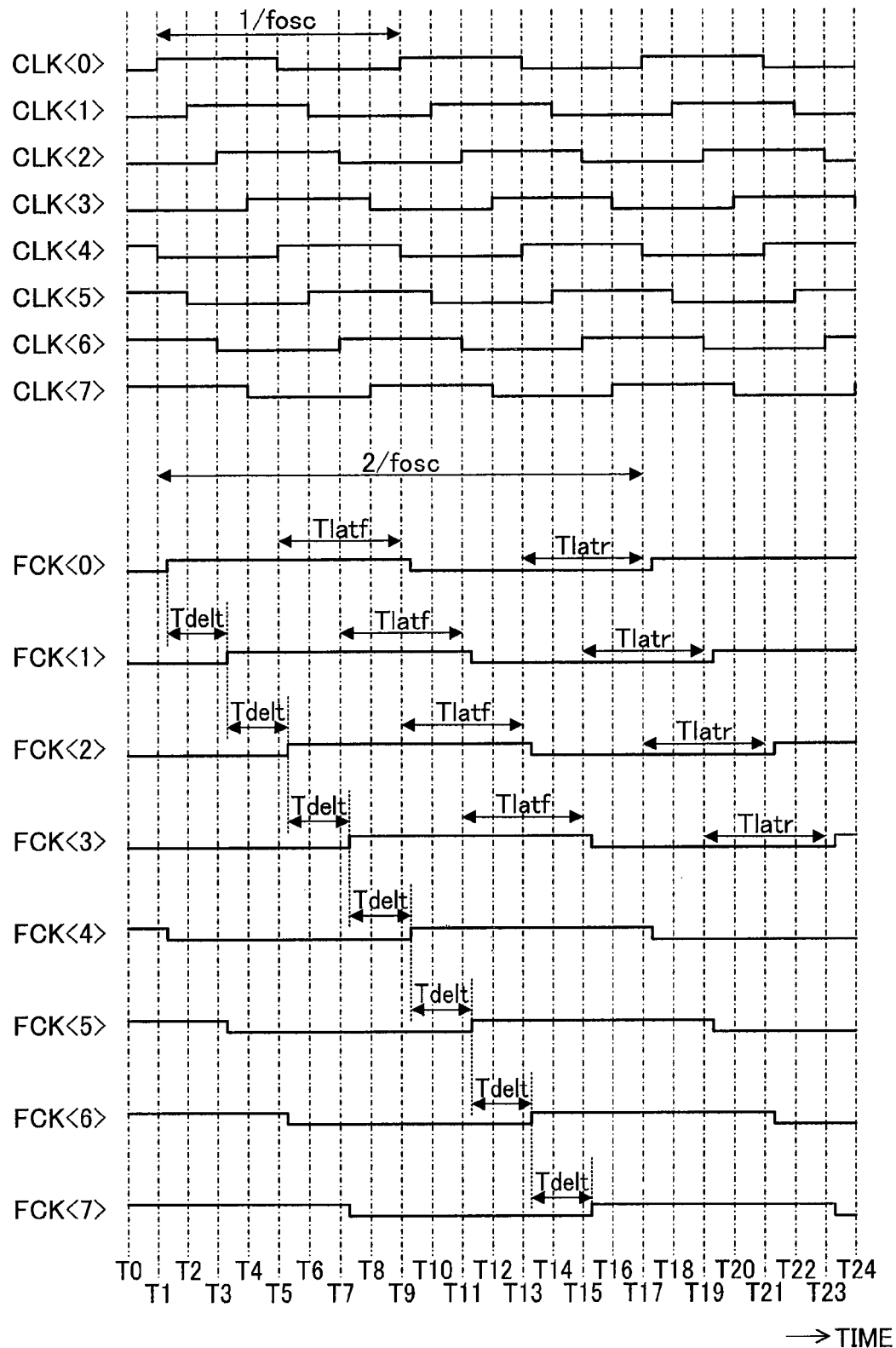
FIG. 6 is a timing diagram showing operation of the divider circuit of FIG. 5.

As a result, as shown in FIG. 6, the low-data latch time Tlatf and the high-data latch time Tlatr are not dependent on the number of phases in the multiple phase clock signal and are almost equal to (1/clock frequency fosc)/2 as in the first embodiment. For example, when the clock frequency fosc=100 MHz, the high-data latch time Tlatr and the low-data latch time Tlatf are each 5 ns. The phase difference between each frequency-divided clock signal can be set by equally dividing the frequency of the frequency-divided clock signals. Specifically, a delay time Tdelt of the rising or falling of the frequency-divided clock signals FCK<0>-FCK<N> can be set to Tdelt=(1/fosc)/2/(N+1).

Note that, as is different from the first embodiment, only the latch circuits DFF<(2×I+1)>(0≦I≦(N−1)/2) of the sub-latch circuit 20 may be used to configure a divider circuit. The relationship between clock signals input to the latch circuits DFF<(2×I+1)> and frequency-divided clock signals output from the latch circuit DFF<(2×I+1)> is described as follows. Specifically, the clock signals CLK<2×I+1> of the clock signals CLK<0>-CLK<N> are input to the latch circuits DFF<2×I+1>, and the frequency-divided clock signals FCK<I> are output from the outputs Q of the latch circuits DFF<2×I+1> and the frequency-divided clock signals FCK<I+(N+1)/2> are output from the inverted outputs NQ of the latch circuits DFF<2×I+1>. Of course, the frequency-divided clock signals FCK<I+(N+1)/2> may be generated from the frequency-divided clock signals FCK<I>.

In both of the cases where the latch circuits DFF<2×I> are used and where the latch circuits DFF<2×I+1> are used, if, of the latch circuits DFF<0>-DFF<N>, the latch circuits DFF<K>(K=0, . . . , (N−1)/2) is connect to the inverted data signal NDTA and the latch circuits DFF<K>(K=(N+1)/2, . . . , N) is connected to the inverted data signal NDTB, the longest low-data latch time Tlatf and high-data latch time Tlatr can be set. The present disclosure is not limited to this. The latch circuits DFF<K>(K=0, . . . , (N−2)) may be connected to the inverted data signal NDTA and the latch circuits DFF<K>(K=(N−1), N) may be connected to the inverted data signal NDTB, or alternatively, the latch circuits DFF<K>(K=0, 1) may be connected to the inverted data signal NDTA and the latch circuits DFF<K>(K=2, . . . , N) may be connected to the inverted data signal NDTB.

Figure 7:
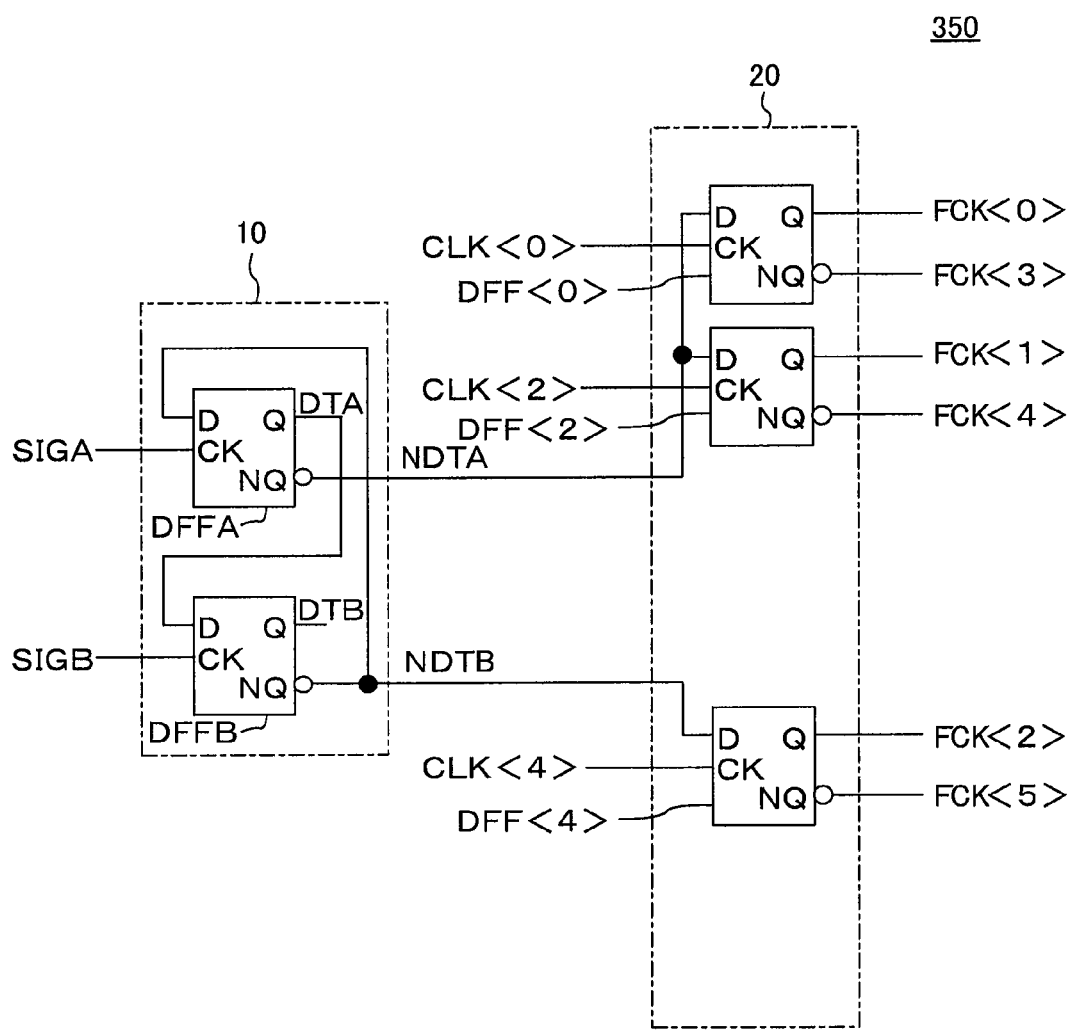
FIG. 7 is a block diagram showing another example of the second embodiment of the present disclosure.

Although an example in which an eight-phase clock signal including the clock signals CLK<0>-CLK<7> is used has been described above, similar operation and advantages can be obtained as long as the multi-phase clock signal includes an even number of clock signals, i.e., an even number of phases (e.g., a divider circuit 350 having a configuration shown in FIG. 7).

<Advantages>

As described above, the clock signals CLK<2×I> and the latch circuits DFF<2×I>, or the clock signals CLK<(2×I+1)> and the latch circuits DFF<2×I+1>, are used to output the frequency-divided clock signals FCK<I> from the outputs Q of the latch circuits DFF<2×I> and the frequency-divided clock signals FCK<I+(N+1)/2> from the inverted outputs NQ. As a result, the phase difference between each frequency-divided clock signal can be set by equally dividing the frequency of the frequency-divided clock signals to set the predetermined delay time Tdelt. Moreover, the number of latch circuits in the sub-latch circuit 20 can be reduced, resulting in a reduction in the circuit area.

Third Embodiment

Figure 8:
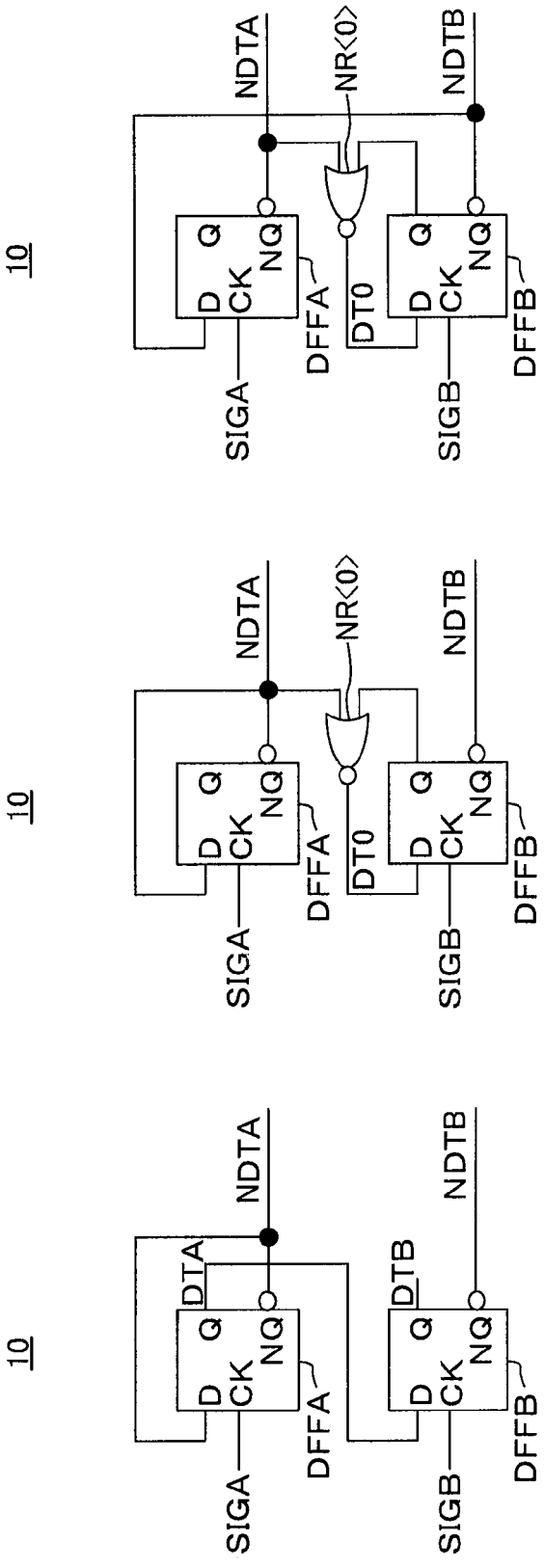
FIGS. 8A-8C are block diagrams each showing a configuration of a main latch circuit in a divider circuit according to a third embodiment of the present disclosure.

FIGS. 8A, 8B, and 8C show variations of the main latch circuit 10. In FIGS. 8B and 8C, a reference character NR<0> indicates a logic element. As in the first embodiment of FIG. 1, only one or two reference clock signals are input to the main latch circuit 10 irrespective of the number of phases in the multiple phase clock signal, and the 180-degree phase difference between the reference clock signals SIGA and SIGB input to the main latch circuit 10 can be ideally ensured. Therefore, as shown in FIGS. 8A, 8B, and 8C, even if an output signal (the output Q or the inverted output NQ) of the latch circuit DFFA is used as a data signal to the latch circuit DFFB, a sufficient data latch time can be ensured. Similarly, even if an output signal (the output Q or the inverted output NQ) of the latch circuit DFFB is used as a data signal to the latch circuit DFFA, a sufficient data latch time can be ensured. With this configuration, a frequency-divided clock signal can be generated while the phase relationship between the reference clock signals SIGA and SIGB is maintained, and the frequency-divided clock signal can be supplied as a data signal to the sub-latch circuit 20 provided downstream from the main latch circuit 10.

Fourth Embodiment

Figure 9:
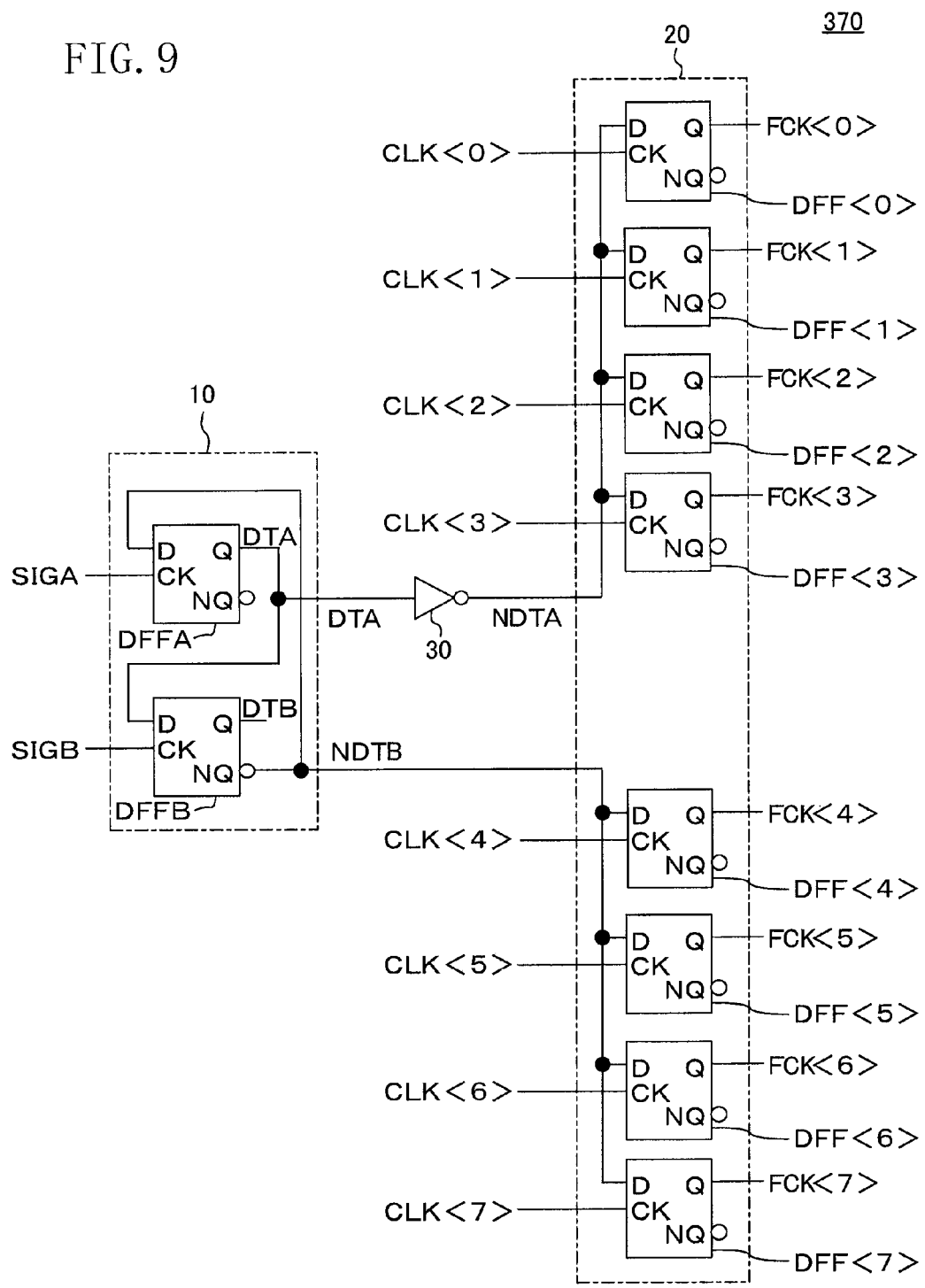
FIG. 9 is a block diagram showing a configuration of a divider circuit according to a fourth embodiment of the present disclosure.

FIG. 9 shows a divider circuit 370 which is different from the divider circuit 100 of FIG. 1 in that a logic element 30 is provided between the main latch circuit 10 and the sub-latch circuit 20. The logic element 30 generates the inverted data signal NDTA by inverting the data signal DTA of the latch circuit DFFA, and supplies the inverted data signal NDTA to the data terminals D of the latch circuits DFF<0>-DFF<3>. With the configuration of the divider circuit 370 of FIG. 9, operation and advantages similar to those of FIG. 1 can be obtained.

Figure 10:
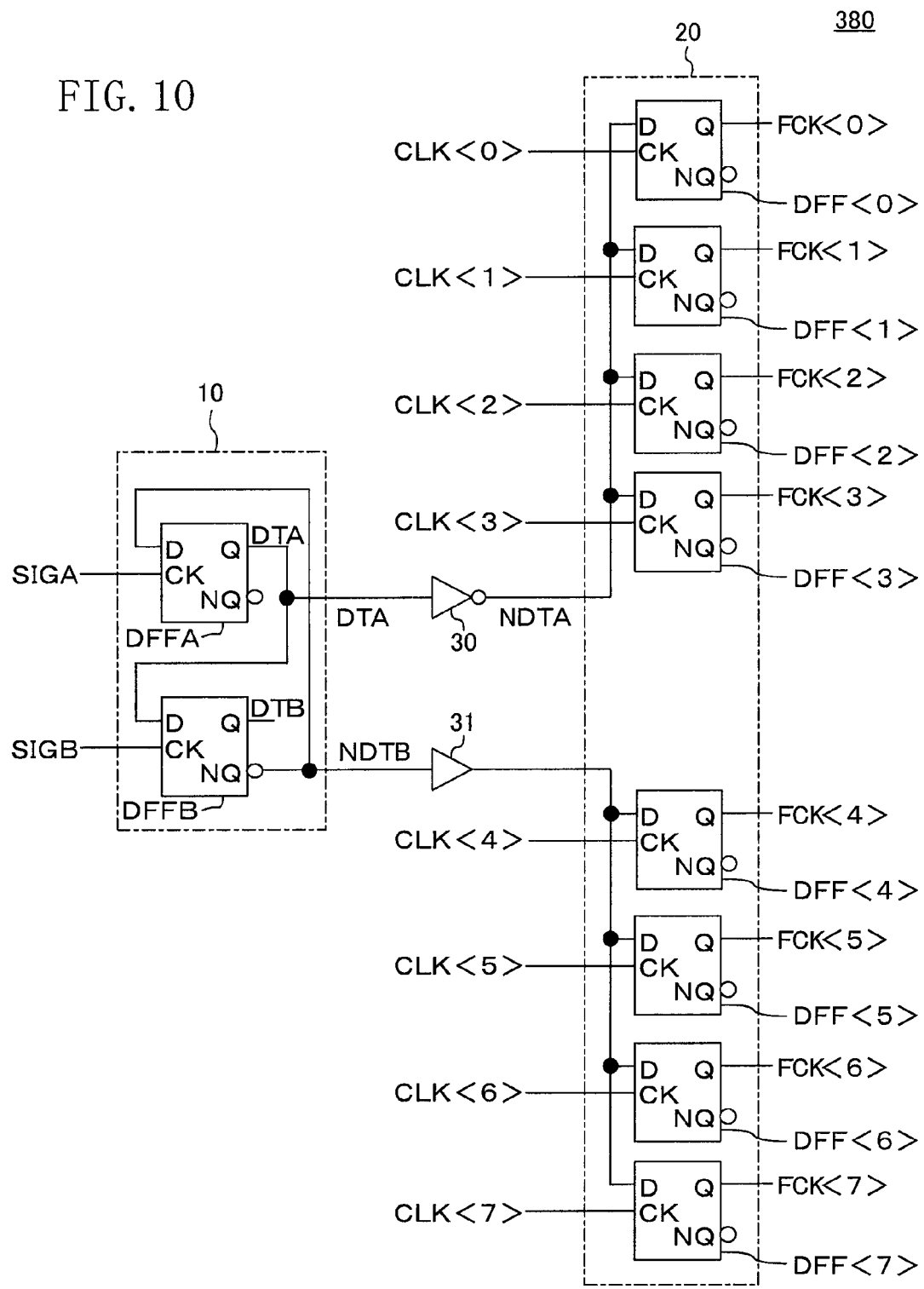
FIG. 10 is a block diagram showing another example of the fourth embodiment of the present disclosure.

FIG. 10 shows a configuration of a divider circuit 380 which is a variation of that of FIG. 9. With this configuration, a logic element 31 having a buffering function may be provided between the inverted data signal NDTB of the latch circuit DFFB and the data terminals D of the latch circuits DFF<4>-DFF<7>.

Fifth Embodiment

Figure 11:
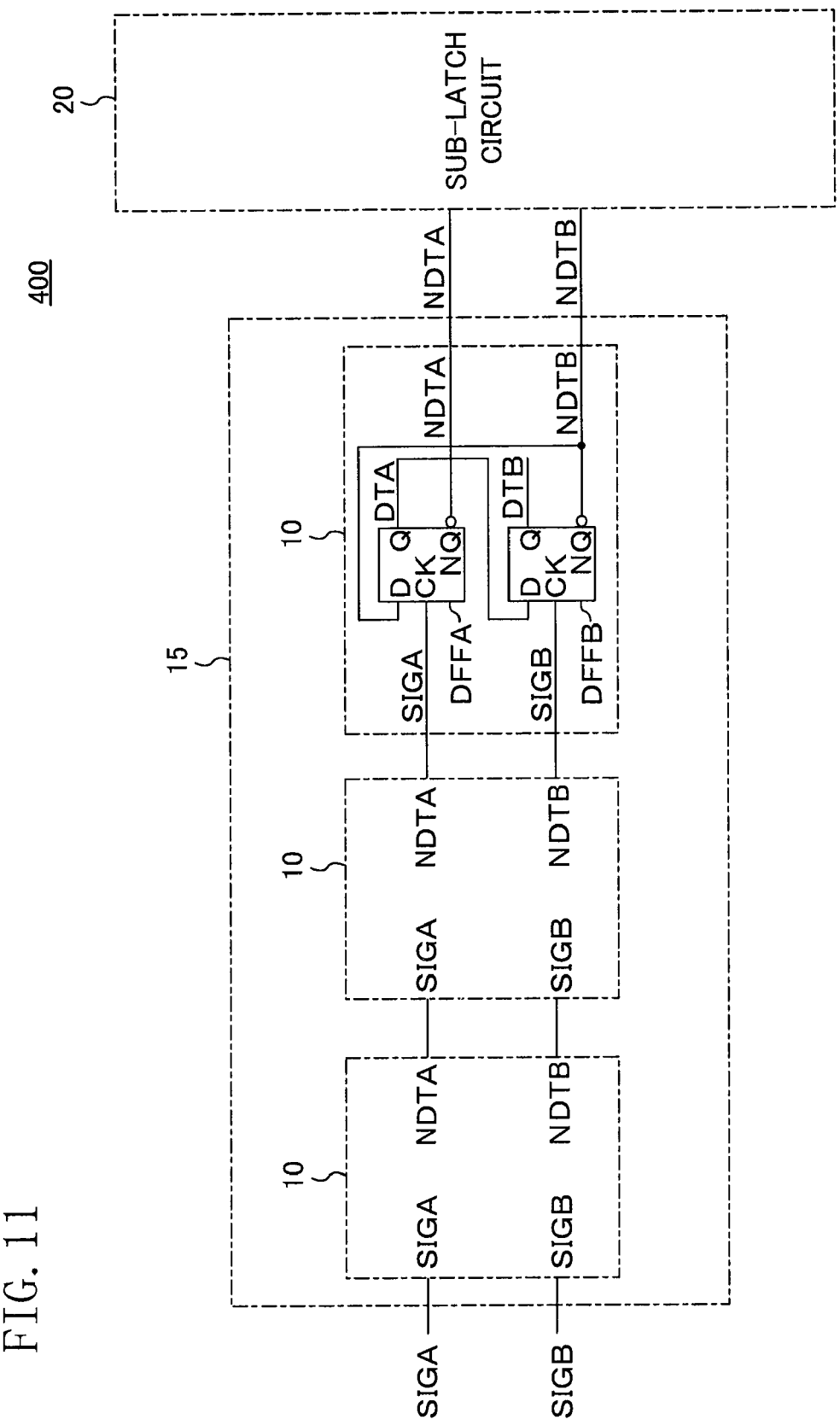
FIG. 11 is a block diagram showing a configuration of a divider circuit according to a fifth embodiment of the present disclosure.

FIG. 11 shows the divider circuit 100 of the first embodiment or the divider circuit 300 of the second embodiment which is adapted to divide the frequency of a multi-phase clock signal by N.

The divider circuit 400 of FIG. 11 includes a multi-stage main latch circuit 15 in which plural main latch circuits 10 are connected in series and can perform a divide-by-N frequency division. In FIG. 11, three main latch circuits 10 are connected in series to perform a divide-by-eight frequency division. As shown in FIG. 1 or FIGS. 8A-8C, each of the main latch circuits 10 may be configured to receive the output signal of another latch circuit and output a frequency-divided signal. The present disclosure is not limited to this configuration as long as a function similar to that of FIG. 1 or FIGS. 8A-8C can be achieved. Of course, any number of the main latch circuits 10 may be connected in series. The number of latch circuits constituting each main latch circuit 10 is not limited to two (DFFA and DFFB). For example, each main latch circuit 10 may include any number of latch circuits, although the main latch circuit 10 of FIG. 4 includes only one latch circuit DFFA.

As described above, when the frequency of a multi-phase clock signal is divided by N, a predetermined number of main latch circuits 10 including a smaller number of latch circuits may be connected in series, resulting in a reduction in the increase in the area.

Sixth Embodiment

Figure 12:
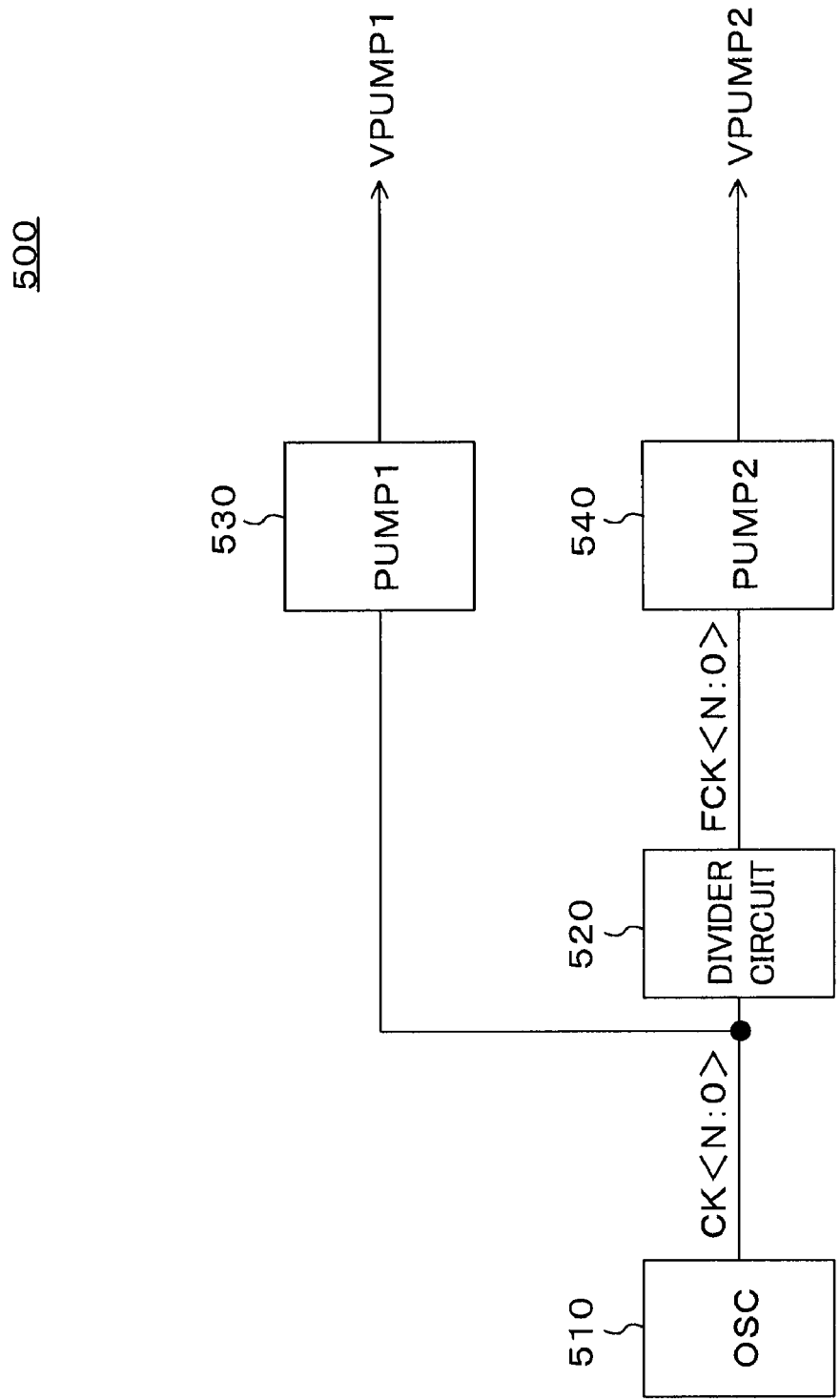
FIG. 12 is a block diagram showing a configuration of an internal voltage generating circuit in which a divider circuit is used according to a sixth embodiment of the present disclosure.
Figure 13:
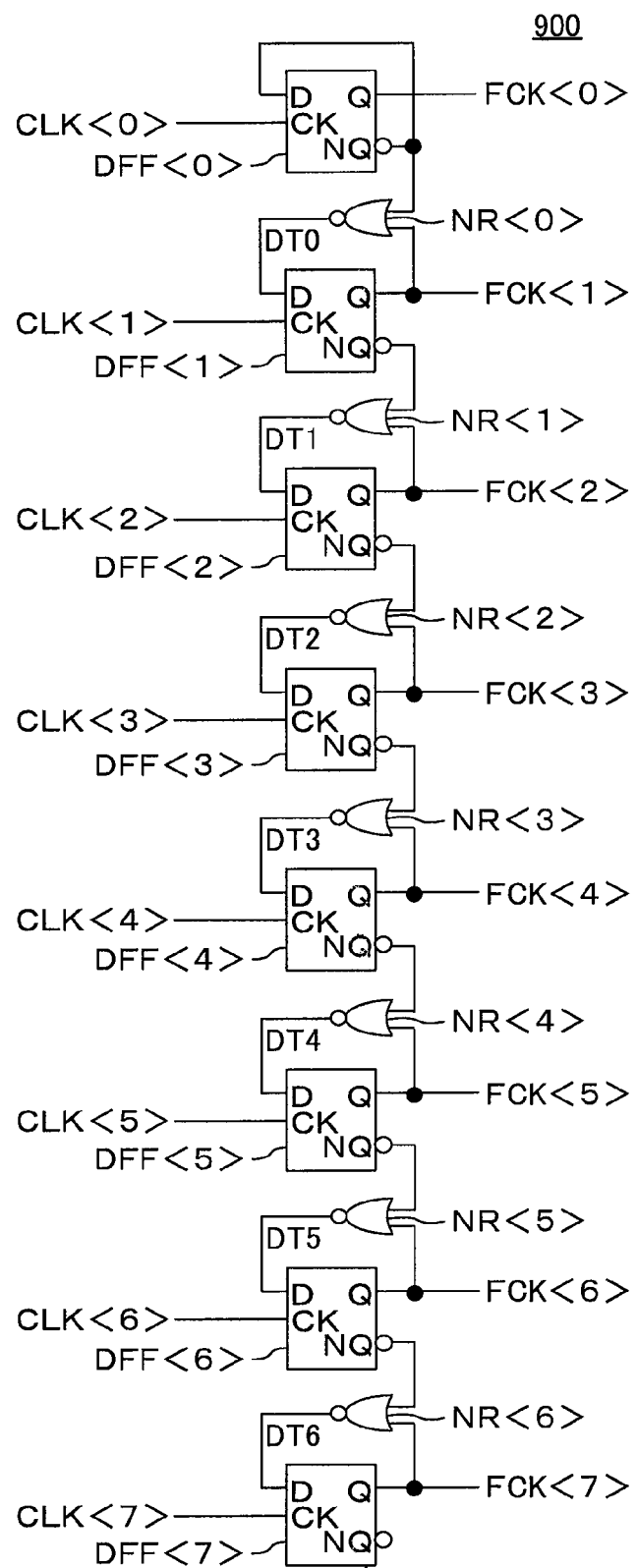
FIG. 13 is a block diagram showing a configuration of a conventional divider circuit.
Figure 14:
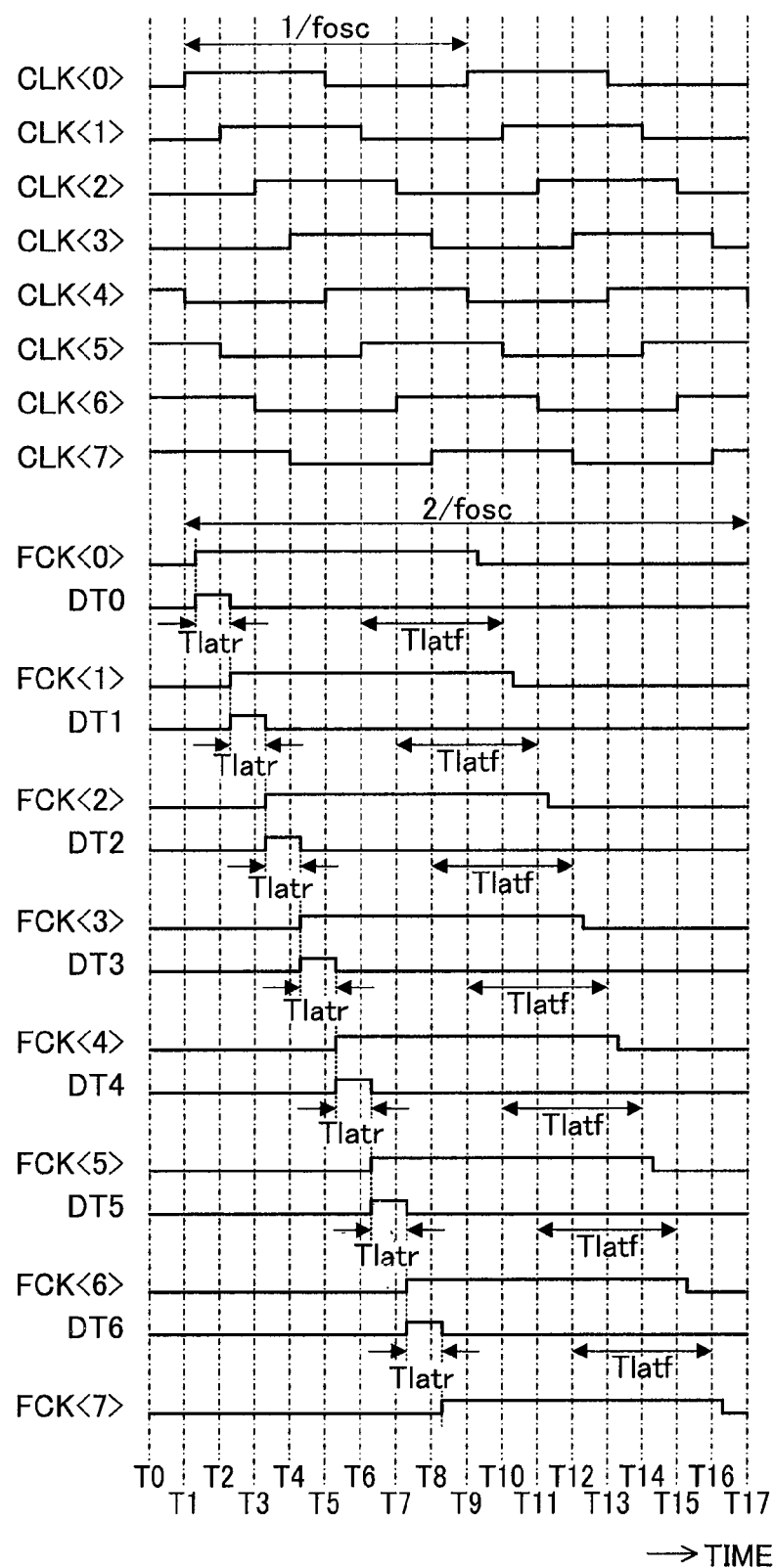
FIG. 14 is a timing diagram showing operation of the divider circuit of FIG. 13.

FIG. 12 shows an example internal voltage generating circuit 500 including a multi-phase divider circuit. The internal voltage generating circuit 500 of FIG. 12 also includes an oscillator circuit (OSC) 510 which generates a multi-phase clock signal including clock signals CK<0>-CK<N>, a multi-phase clock divider circuit 520 which divides the frequency of the clock signals CK<0>-CK<N> to generate frequency-divided clock signals FCK<0>-FCK<N> having multiple phases, a first booster circuit (PUMP1) 530 which performs voltage boosting operation to generate a boosted voltage VPUMP1 in synchronization with the clock signals CK<0>-CK<N>, and a second booster circuit (PUMP2) 540 which performs voltage boosting operation to generate a boosted voltage VPUMP2 in synchronization with the frequency-divided clock signals FCK<0>-FCK<N>.

In the internal voltage generating circuit 500 of FIG. 12, by employing the multi-phase clock divider circuit 520, the oscillator circuit 510 can be shared, resulting in a reduction in the increase in the circuit area and a reduction in the variation in the output voltage. Of course, the frequency division ratio of the multi-phase clock divider circuit 520 is not limited to two, and as described in the fifth embodiment, may be four, eight, and the like by connecting in series a number of the divider circuits 100 of the first embodiment, the divider circuits 300 of the second embodiment, or the like.

The divider circuit of the present disclosure can divide the frequency of a multi-phase clock signal having a high frequency while maintaining or equally distributing the phase relationship, and is applicable to various parts which require the function of dividing a multi-phase clock signal and are used in booster circuits and CMOS processes used in nonvolatile semiconductor memory devices.

What is claimed is:

1. A divider circuit comprising:
   M first dividers configured to receive M first signals, where M is an integer of 2 or more; and
   N second dividers configured to receive N second signals, where N is an integer more than or equal to M,
   wherein
   an I-th one of the first dividers outputs a third signal obtained by dividing a frequency of one of the first signals input to the I-th first divider according to an output of a J-th first driver, where I is an integer of 1 to M, J is I−1, and J is 1 or M when I is 1 and
   a K-th one of the second dividers inputs the third signal and outputs a fourth signal having a frequency similar to that of the third signal input to the K-th second divider based on one of the second signals input to the K-th second divider, where K is an integer of 1 to N.

2. The divider circuit of claim 1, wherein the I-th first divider receives the third signal output from one of the other first dividers.

3. The divider circuit of claim 1, wherein the M first signals are each the same as one of the N second signals.

4. The divider circuit of claim 1, wherein the M first signals and the N second signals have the same frequency.

5. The divider circuit of claim 1, wherein the M first signals and the N second signals are clock signals having different phases.

6. The divider circuit of claim 1, wherein
   L stages of the M first dividers are connected in series, where L is an integer of 2 or more, and
   the L stages of the M first dividers output the third signal having the frequency divided by $2^L$.

7. The divider circuit of claim 6, wherein each first divider in the L stages of the M first dividers receives the third signal output from one of the other first dividers in the same stage.

8. A booster circuit for performing voltage boosting operation in accordance with a frequency-divided clock signal which is output as the fourth signal by the divider circuit of claim 1.

9. A divider circuit comprising:
   M first dividers configured to receive M first signals, where M is an integer of 2 or more; and
   N second dividers configured to receive N second signals, where N is an integer more than or equal to M,
   wherein
   an I-th one of the first dividers has a first input terminal to which the corresponding first signal is input, a first output terminal from which a third signal obtained by dividing a frequency of the corresponding first signal is output, and a second input terminal to which the third signal of the (I−1)th first divider is input, where I is an integer of 2 to M, and
   a K-th one of the second dividers has a third input terminal to which the corresponding second signal is input, a fourth input terminal to which the corresponding third signal is input, and a second output terminal from which a fourth signal having a frequency similar to that of the corresponding third signal is output, where K is an integer of 1 to N.

10. The divider circuit of claim 9, wherein the M first signals are each the same as one of the N second signals.

11. The divider circuit of claim 9, wherein the third signal of the J-th first divider where J is 1 or M is input to the second input terminal of the J-th first divider where J is 1.

12. The divider circuit of claim 9, wherein the third signal is input to the second input terminal of the J-th first divider where J is 1 to M via a logic element.

13. The divider circuit of claim 9, wherein the third signal is input to the fourth input terminal of the K-th second divider where K is 1 to M via a logic element.

14. The divider circuit of claim 9, wherein the M first signals and the N second signals are clock signals having different phases.

15. The divider circuit of claim 9, wherein

L stages of the M first dividers are connected in series, where L is an integer of 2 or more, and the L stages of the M first dividers output the third signal having the frequency divided by $2^L$.

16. The divider circuit of claim 15, wherein each first divider in the L stages of the M first dividers receives the third signal output from one of the other first dividers in the same stage.

17. A booster circuit for performing voltage boosting operation in accordance with a frequency-divided clock signal which is output as the fourth signal by the divider circuit of claim 9.

* * * * *